United States Patent
Itzhak et al.

(10) Patent No.: US 8,586,903 B2
(45) Date of Patent: Nov. 19, 2013

(54) COUNTER CIRCUITS, ANALOG TO DIGITAL CONVERTERS, IMAGE SENSORS AND DIGITAL IMAGING SYSTEMS INCLUDING THE SAME

(75) Inventors: Yair Itzhak, Hadera (IL); Shy Hamami, Ness-Ziona (IL); Uzi Hizi, Herzliya (IL)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 362 days.

(21) Appl. No.: 12/907,492

(22) Filed: Oct. 19, 2010

(65) Prior Publication Data

US 2011/0121161 A1   May 26, 2011

Related U.S. Application Data

(60) Provisional application No. 61/272,943, filed on Nov. 23, 2009, provisional application No. 61/272,941, filed on Nov. 23, 2009.

(51) Int. Cl.
*H01L 27/148* (2006.01)
*H03K 25/00* (2006.01)
*H03M 1/12* (2006.01)

(52) U.S. Cl.
USPC .................................. 250/208.1; 341/155

(58) Field of Classification Search
USPC ............................ 250/208.1, 214 DC, 214 R; 341/155–159, 118–120
See application file for complete search history.

(56) References Cited

U.S. PATENT DOCUMENTS

| 4,078,983 | A | * | 3/1978 | Higgins | 204/229.2 |
| 5,159,696 | A | * | 10/1992 | Hartnett | 377/55 |
| 6,411,669 | B1 | | 6/2002 | Kim | |
| 2006/0012698 | A1 | | 1/2006 | Nitta et al. | |
| 2008/0278363 | A1 | | 11/2008 | Okumura | |

FOREIGN PATENT DOCUMENTS

| JP | 06-197012 A | 7/1994 |
| JP | 10-107619 A | 4/1998 |
| KR | 10-0471145 B1 | 2/2005 |
| KR | 2008-0043141 A | 5/2008 |
| KR | 2009-0022002 A | 3/2009 |

* cited by examiner

*Primary Examiner* — Seung C Sohn
(74) *Attorney, Agent, or Firm* — Harness, Dickey & Pierce, P.L.C.

(57) ABSTRACT

A counter circuit for an analog to digital converter includes: a plurality of counter stages configured to obtain an integer multiple of a digital gain for the analog to digital converter by bypassing at least one of the plurality of counter stages. An analog-to-digital converter includes at least one counter circuit, and an image sensor includes the analog-to-digital converter, which includes the counter circuit.

35 Claims, 9 Drawing Sheets

COUNTER CIRCUITS, ANALOG TO DIGITAL CONVERTERS, IMAGE SENSORS AND DIGITAL IMAGING SYSTEMS INCLUDING THE SAME

CROSS-REFERENCE TO RELATED APPLICATION(S)

This application claims priority under 35 U.S.C. §119(e) to provisional application No. 61/272,943, filed on Nov. 23, 2009, and provisional application No. 61/272,941, filed on Nov. 23, 2009. The entire contents of each of these applications are incorporated herein by reference.

BACKGROUND

An image sensor converts an optical image into an electrical signal. Types of image sensors include charge-coupled devices (CCDs) and complementary-metal-oxide-semiconductor (CMOS) image sensors. Image sensors are commonly used in digital cameras as well as other imaging devices.

Image sensors include pixels, which accumulate charge when illuminated by light. Conventionally, pixels accumulate a charge in an analog circuit for a continuous period of time referred to as an exposure time. The accumulated charge is transferred to an analog-to-digital (A/D) converter, which converts the accumulated charge into a digital value for that pixel. Conventionally, an image sensor outputs a two-dimensional (2D) array of digital values.

SUMMARY

Example embodiments provide counter circuits for analog-to-digital converters (ADCs) capable of enhancing digital gain by a factor of, for example, 2, 4, 8, etc., during the conversion phase. Together with a piece-wise linear ramp generator, this allows for a more robust multi-resolution ADC conversion with linear digital output.

At least one example embodiment provides a counter circuit for an analog to digital converter. According to at least this example embodiment, a counter circuit includes: a plurality of counter stages configured to obtain an integer multiple of a digital gain for the analog to digital converter by bypassing at least one of the plurality of counter stages.

At least one other example embodiment provides an image sensor. The image sensor includes: an active pixel array; a line driver and an analog to digital converter. The active pixel array includes a plurality of pixels arranged in an array. The line driver is configured to select rows of pixels for output by the active pixel array. The analog to digital converter includes: a comparator circuit; a counter bank and a line memory. The comparator circuit is configured to generate a comparison signal corresponding to each column of a pixel array. Each comparison signal is generated based on a comparison between an input signal corresponding to a column of the pixel array and a ramp signal. The counter bank is configured to convert each of the generated comparison signals into a digital output signal. The counter bank includes at least one counter circuit. The at least one counter circuit includes: a plurality of counter stages configured to obtain an integer multiple of a digital gain for the analog to digital converter by bypassing at least one of the plurality of counter stages. The line memory is configured to store the digital outputs from the counter bank.

At least one other example embodiment provides a digital imaging system. The digital imaging system includes: a processor and an image sensor. The processor is configured to process captured image data, and the image sensor is configured to capture image data by converting optical images into electrical signals.

The image sensor includes: an active pixel array; a line driver and an analog to digital converter. The active pixel array includes a plurality of pixels arranged in an array. The line driver is configured to select rows of pixels for output by the active pixel array. The analog to digital converter includes: a comparator circuit; a counter bank and a line memory. The comparator circuit is configured to generate a comparison signal corresponding to each column of a pixel array. Each comparison signal is generated based on a comparison between an input signal corresponding to a column of the pixel array and a ramp signal. The counter bank is configured to convert each of the generated comparison signals into a digital output signal. The counter bank includes at least one counter circuit. The at least one counter circuit includes: a plurality of counter stages configured to obtain an integer multiple of a digital gain for the analog to digital converter by bypassing at least one of the plurality of counter stages. The line memory is configured to store the digital outputs from the counter bank.

According to at least some example embodiments, the counter circuit may include: a first multiplexer and a demultiplexer. The first multiplexer may be coupled between a first and a second of the plurality of counter stages. The demultiplexer may be configured to selectively output a received clock to the first of the plurality of counter stages and the first multiplexer. The first counter stage may include: a first counter configured to toggle a state of a first output clock in response to a change in state of the received clock. The first multiplexer may be configured to selectively output the received clock and the first output clock in response to a first digital gain selection signal.

The counter circuit may further include: a second multiplexer coupled between the second of the plurality of counter stages and a third of the plurality of counter stages. The second of the plurality of counter stages may include: a second counter configured to toggle a state of a second output clock in response to a change in state of an input from the first multiplexer. The second multiplexer may be configured to selectively output one of the received clock and the second output clock in response to a second digital gain selection signal.

Remaining ones of the plurality of counter stages may be connected in series with the third of the plurality of counter stages, and each remaining one of the plurality of counter stages may include: a counter circuit configured to toggle a state of an output clock in response to a change in state of an input clock from a preceding counter stage; and a storage device configured to store the state of the output clock.

According to at least some other example embodiments, the counter circuit may include: a first latch coupled between a first and a second of the plurality of counter stages. The first of the plurality of counter stages may include: a first counter configured to toggle a state of a first output clock in response to a change in state of a received clock. The first latch may be configured to store and output the first output clock based on a first digital gain selection signal.

The second of the plurality of counter stages may include a second counter configured to toggle a state of a second output clock in response to a change in state of an output from the first latch. In addition, the counter circuit may further include: a first multiplexer configured selectively output one of the first output clock and the second output clock in response to a second digital gain selection signal; and a second latch configured to delay the output from the first multiplexer in response to a second digital gain selection signal.

Remaining ones of the plurality of counter stages may be connected serially with the second of the plurality of counter stages. A third of the plurality of counter stages may be configured to toggle a state of a third output clock in response to a change in state of the output from the second latch, and a second multiplexer may be coupled between the third and a fourth of the plurality of counter stages. The second multiplexer may be configured to selectively output one of the first output clock and the third output clock in response to the second digital gain selection signal.

At least one other example, embodiment provides an analog to digital converter having increased digital gain. The analog to digital converter includes: a comparator circuit; a counter bank and a line memory. The comparator circuit is configured to generate a comparison signal corresponding to each column of a pixel array. Each comparison signal is generated based on a comparison between an input signal corresponding to a column of the pixel array and a ramp signal. The counter bank is configured to convert each of the generated comparison signals into a digital output signal. The counter bank includes at least one counter circuit. The at least one counter circuit includes: a plurality of counter stages configured to obtain an integer multiple of a digital gain for the analog to digital converter by bypassing at least one of the plurality of counter stages. The line memory is configured to store the digital outputs from the counter bank.

According to at least some example embodiments, the counter bank may include a plurality of counter circuits. Each of the plurality of counter circuits may correspond to a column of the pixel array, and be configured to convert an output of the corresponding column of the pixel array into a digital output signal.

In one example, each of the plurality of counter circuits may include: a first multiplexer and a demultiplexer. The first multiplexer may be coupled between a first and a second of the plurality of counter stages. The demultiplexer may be configured to selectively output a received clock to the first of the plurality of counter stages and the first multiplexer. The first counter stage may include: a first counter configured to toggle a state of a first output clock in response to a change in state of the received clock. The first multiplexer may be configured to selectively output the received clock and the first output clock in response to a first digital gain selection signal.

Each of the plurality of counter circuits may further include: a second multiplexer coupled between the second of the plurality of counter stages and a third of the plurality of counter stages. The second of the plurality of counter stages may include: a second counter configured to toggle a state of a second output clock in response to a change in state of an input from the first multiplexer. The second multiplexer may be configured to selectively output one of the received clock and the second output clock in response to a second digital gain selection signal.

Remaining ones of the plurality of counter stages may be connected in series with the third of the plurality of counter stages, and each remaining one of the plurality of counter stages may include: a counter circuit configured to toggle a state of an output clock in response to a change in state of an input clock from a preceding counter stage; and a storage device configured to store the state of the output clock.

In another example, each of the plurality of counter circuits may include: a first latch coupled between a first and a second of the plurality of counter stages. The first of the plurality of counter stages may include: a first counter configured to toggle a state of a first output clock in response to a change in state of a received clock. The first latch may be configured to store and output the first output clock based on a first digital gain selection signal.

The second of the plurality of counter stages may include a second counter configured to toggle a state of a second output clock in response to a change in state of an output from the first latch. In addition, each of the plurality of counter circuits may further include: a first multiplexer configured selectively output one of the first output clock and the second output clock in response to a second digital gain selection signal; and a second latch configured to delay the output from the first multiplexer in response to a second digital gain selection signal.

Remaining ones of the plurality of counter stages may be connected serially with the second of the plurality of counter stages. A third of the plurality of counter stages may be configured to toggle a state of a third output clock in response to a change in state of the output from the second latch, and a second multiplexer may be coupled between the third and a fourth of the plurality of counter stages. The second multiplexer may be configured to selectively output one of the first output clock and the third output clock in response to the second digital gain selection signal.

According to at least some other example embodiments, the counter bank may include a single counter circuit shared by each of the plurality of columns of pixels.

In one example, the single counter circuit may include: a first multiplexer and a demultiplexer. The first multiplexer may be coupled between a first and a second of the plurality of counter stages. The demultiplexer may be configured to selectively output a received clock to the first of the plurality of counter stages and the first multiplexer. The first counter stage may include: a first counter configured to toggle a state of a first output clock in response to a change in state of the received clock. The first multiplexer may be configured to selectively output the received clock and the first output clock in response to a first digital gain selection signal.

The single counter circuit may further include: a second multiplexer coupled between the second of the plurality of counter stages and a third of the plurality of counter stages. The second of the plurality of counter stages may include: a second counter configured to toggle a state of a second output clock in response to a change in state of an input from the first multiplexer. The second multiplexer may be configured to selectively output one of the received clock and the second output clock in response to a second digital gain selection signal.

Remaining ones of the plurality of counter stages may be connected in series with the third of the plurality of counter stages, and each remaining one of the plurality of counter stages may include: a counter circuit configured to toggle a state of an output clock in response to a change in state of an input clock from a preceding counter stage; and a storage device configured to store the state of the output clock.

In another example, the single counter circuit may include: a first latch coupled between a first and a second of the plurality of counter stages. The first of the plurality of counter stages may include: a first counter configured to toggle a state of a first output clock in response to a change in state of a received clock. The first latch may be configured to store and output the first output clock based on a first digital gain selection signal.

The second of the plurality of counter stages may include a second counter configured to toggle a state of a second output clock in response to a change in state of an output from the first latch. In addition, the single counter circuit may further include: a first multiplexer configured selectively output one of the first output clock and the second output clock in response to a second digital gain selection signal; and a second latch configured to delay the output from the first multiplexer in response to a second digital gain selection signal.

Remaining ones of the plurality of counter stages may be connected serially with the second of the plurality of counter stages. A third of the plurality of counter stages may be configured to toggle a state of a third output clock in response to a change in state of the output from the second latch, and a second multiplexer may be coupled between the third and a fourth of the plurality of counter stages. The second multiplexer may be configured to selectively output one of the first output clock and the third output clock in response to the second digital gain selection signal.

BRIEF DESCRIPTION OF THE DRAWINGS

Example embodiments will become more appreciable through the description of the drawings in which.

DETAILED DESCRIPTION

Figure 1:
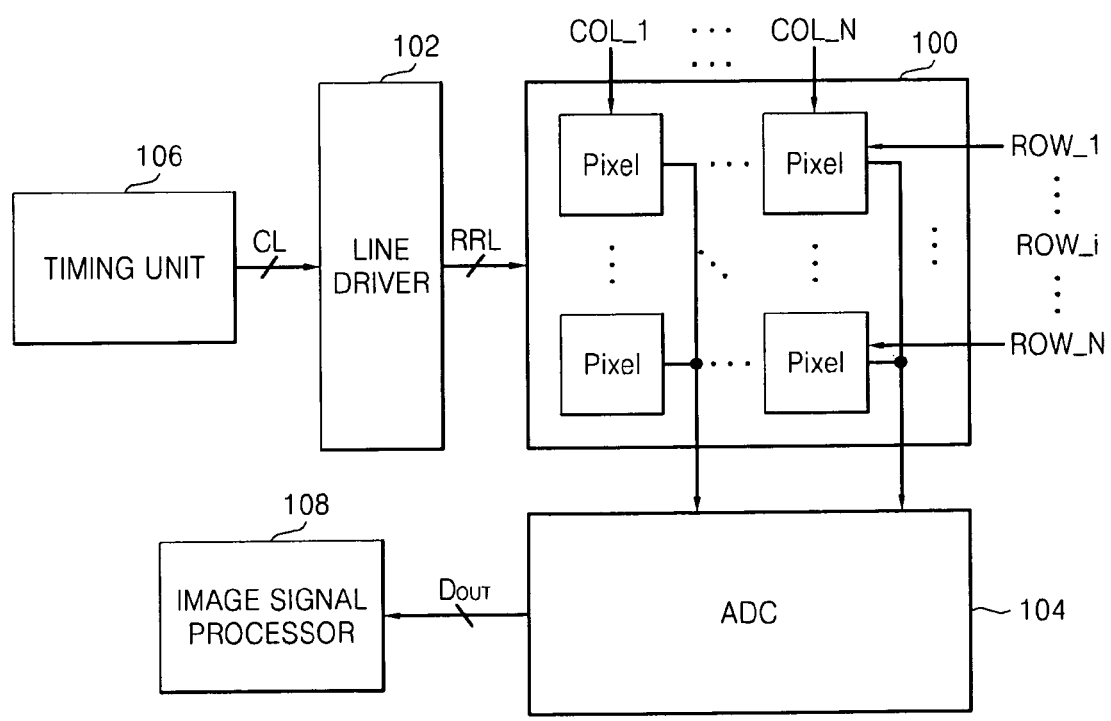
FIG. 1 is a block diagram of an image sensor according to an example embodiment.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In conventional multi-resolution analog-to-digital converters (ADCs), the digital output data (or digital code) is post-processed (e.g., by an image signal processor) to achieve a linear input required by image-processing algorithms. Thus, the post-processing blocks must have relatively detailed knowledge of the conversion curve for the ADC. As is known, the conversion curve for the ADC correlates the digital output to the analog input.

On the other hand, if the slope of the ramp signal VRAMP (also referred to as "ramp slope") and the digital gain employed by the counter are correlated to one another, then the output data is linear and the multi-resolution conversion is transparent to the back-end processing at the image sensor.

At least one example embodiment provides a ripple-counter circuit capable of applying digital gain for some or all counting phases allowing for linear output data. Example embodiments also provide counters and counter circuits with digital gains correlated to a ramp signal.

As will be described in more detail below, example embodiments may be implemented in conjunction with a Gray code counter (GCC) and/or a per-column binary counter. As discussed herein, example embodiments may be implemented as a double data rate (DDR) counter, which may further improve power consumption. In another example, a per-column implementation may perform bit-wise inversion for correlated double sampling (CDS) subtraction. However, the same or substantially the same digital gain concepts may be applied to any ripple counter.

FIG. 1 illustrates a complementary-metal-oxide-semiconductor (CMOS) image sensor according to an example embodiment.

Referring to FIG. 1, a timing unit or circuit 106 controls a line driver 102 through one or more control lines CL. In one example, the timing unit 106 causes the line driver 102 to generate a plurality of read and reset pulses. The line driver 102 outputs the plurality of read and reset pulses to a pixel array 100 over a plurality of read and reset lines RRL.

The pixel array 100 includes a plurality of pixels arranged in an array of rows ROW_1-ROW_N and columns COL_1-COL_N. Each of the plurality of read and reset lines RRL corresponds to a row of pixels in the pixel array 100. In FIG. 1, each pixel may be an active-pixel sensor (APS), and the pixel array 100 may be an APS array.

In more detail with reference to example operation of the image sensor in FIG. 1, read and reset pulses for an ith row ROW_i (where i={1, ..., N}) of the pixel array 100 are output from the line driver 102 to the pixel array 100 via an ith one of the read and reset lines RRL. In one example, the line driver 102 applies a reset signal to the ith row ROW_i of the pixel array 100 to begin an exposure period. After a given, desired or predetermined exposure time, the line driver 102 applies a read signal to the same ith row ROW_i of the pixel array 100 to end the exposure period. The application of the read signal also initiates reading out of pixel information (e.g., exposure data) from the pixels in the ith row ROW_i.

The analog-to-digital converter (ADC) 104 converts the output voltages from the ith row ROW_i of readout pixels into a digital signal (or digital data). The ADC 104 may perform this conversion either serially or in parallel. An ADC 104 having a column parallel-architecture converts the output voltages into a digital signal in parallel. The ADC 104 then outputs the digital data (or digital code) DOUT to a next stage processor such as an image signal processor (ISP) 108, which processes the digital data DOUT to generate an image. In one example, the ISP 108 may also perform image processing operations on the digital data including, for example, gamma correction, auto white balancing, application of a color correction matrix (CCM), and handling chromatic aberrations.

Figure 2A:
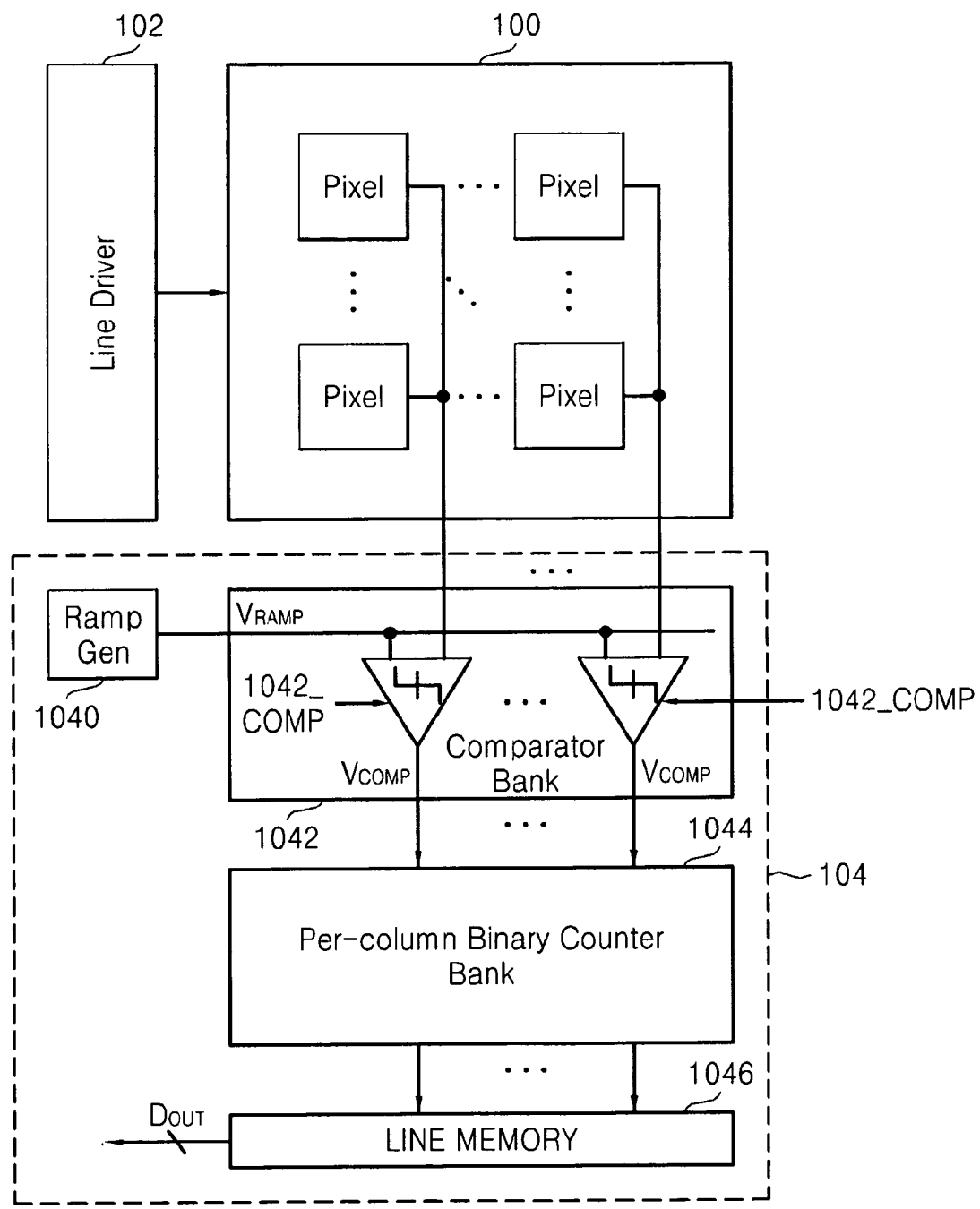
FIGS. 2A and 2B are block diagrams showing more detailed illustrations of analog-to-digital converters according to example embodiments.
Figure 2B:
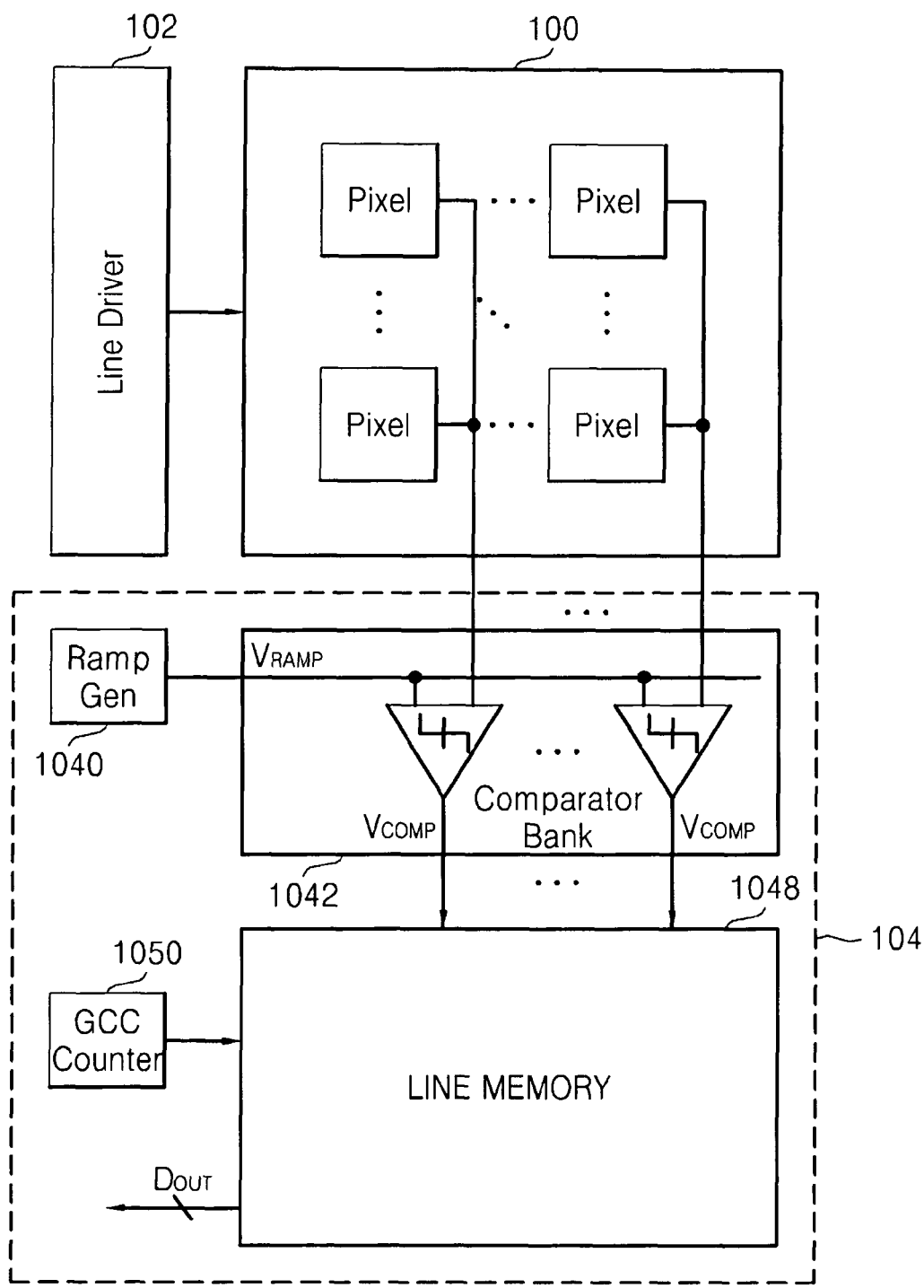

FIGS. 2A and 2B show more detailed example illustrations of the ADC shown in FIG. 1.

Figure 3:
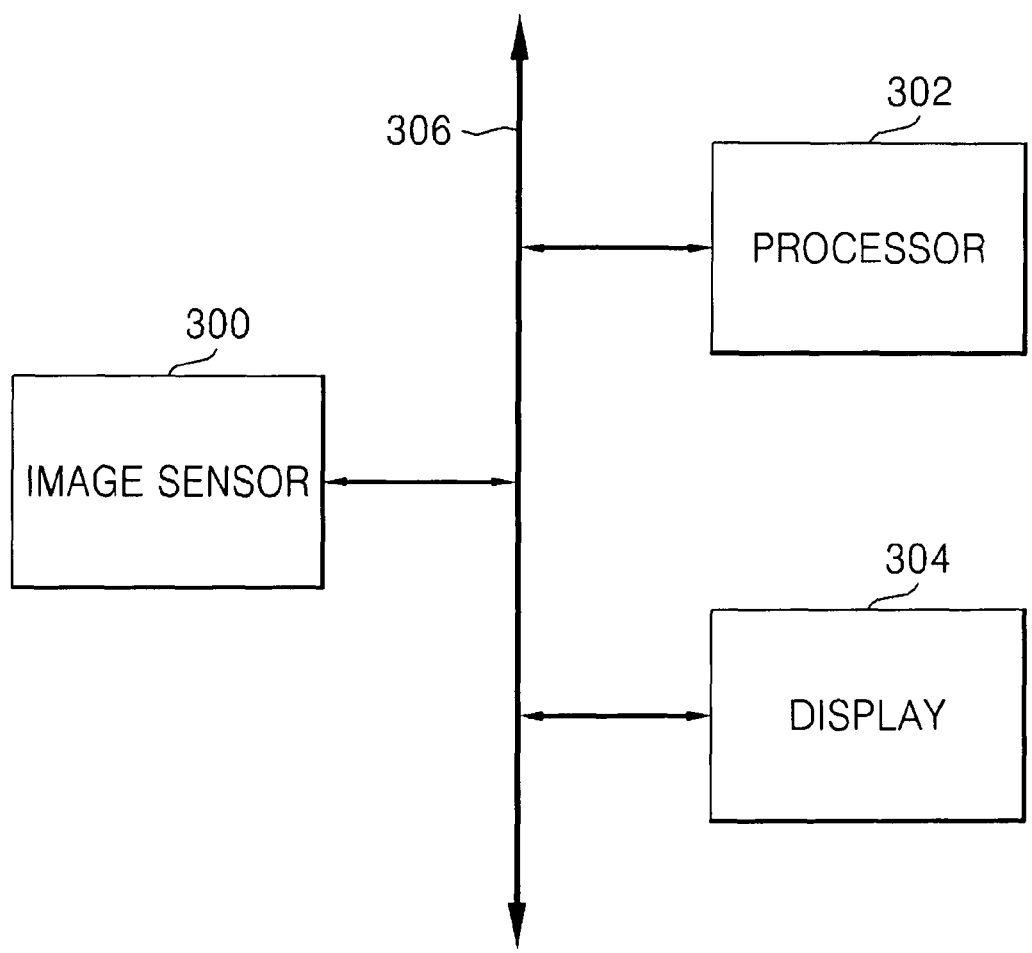
FIG. 3 illustrates a digital imaging system according to an example embodiment.
Figure 4:
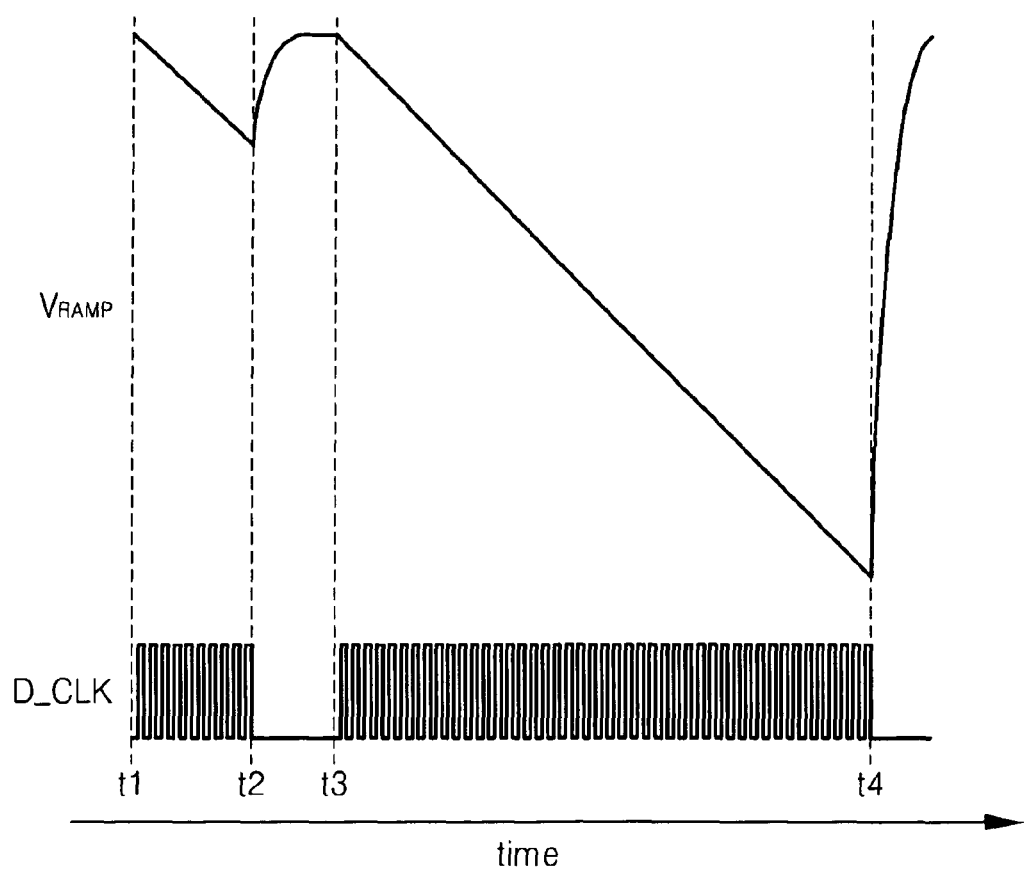
FIG. 4 shows a ramp signal and corresponding input clock for a correlated double sampling (CDS) example.
Figure 5:
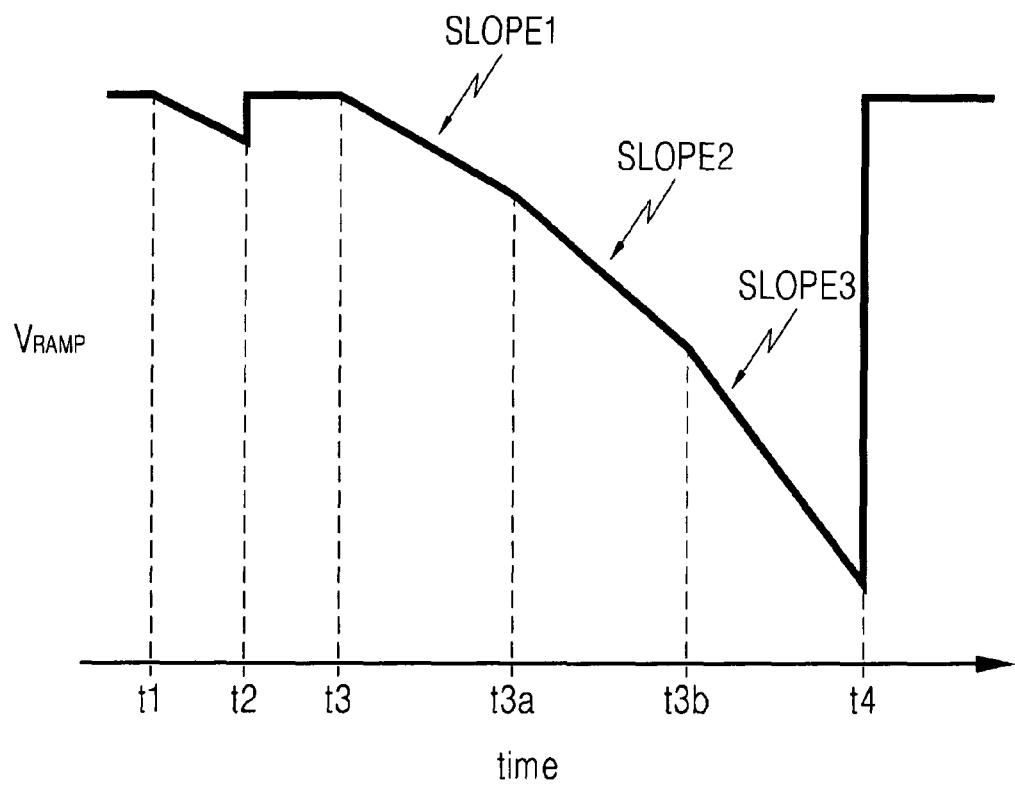
FIG. 5 is a graph illustrating an example piece-wise linear ramp signal for a multi-resolution analog-to-digital converter (ADC)

Referring to FIG. 2A, a ramp generator 1040 generates a or ramp signal VRAMP and outputs the generated ramp signal VRAMP to the comparator bank 1042. As shown in FIGS. 3-5, the ramp signal VRAMP is voltage signal which changes over time. The comparator bank 1042 compares the ramp signal VRAMP with each output from the pixel array 100 to generate a plurality of comparison signals VCOMP.

In more detail, the comparator bank 1042 includes a plurality of comparators 1042_COMP. Each of the plurality of comparators 1042_COMP corresponds to one of columns COL_1-COL_N of pixels P in the pixel array 100. In example operation, each comparator 1042_COMP generates a comparison signal VCOMP by comparing the output of a corresponding pixel to the ramp signal VRAMP. The toggling time of the output of each comparator 1042_COMP is correlated to the pixel output voltage.

The comparator bank 1042 outputs the comparison signals VCOMP to a counter bank 1044, which converts the comparison signals VCOMP into digital output signals.

In more detail, the counter bank 1044 includes a counter for each of columns COL_1-COL_N of the pixel array 100, and each counter converts a corresponding comparison signal VCOMP into a digital output signal. Counter circuits of the counter bank 1044 according to example embodiments will be discussed in more detail later with regard to FIGS. 7 and 8. The counter bank 1044 outputs the digital output signals to a line memory 1046.

The line memory 1046 stores the digital data from the counter bank 1044 while output voltages for a next row (e.g., ROW_i+1) of pixels are converted into digital output signals.

Referring to FIG. 2B, in this example the comparator 1042 outputs the comparison signals VCOMP to the line memory 1048 as opposed to the binary counter bank 1044 shown in FIG. 2A. Otherwise, the ramp generator 1040 and the comparator bank 1042 are the same as described above with regard to FIG. 2A.

A Gray code counter (GCC) 1050 is coupled to the line memory 1048. In this example, the GCC 1050 generates a sequentially changing Gray code. A counter circuit of the GCC 1050 will be discussed in more detail later.

The line memory 1048 stores the sequentially changing Gray code from the GCC 1050 at a certain time point based on the comparison signals VCOMP received from the comparator bank 1042. The stored Gray code represents the intensity of light received at the pixel or pixels.

FIG. 3 is a block diagram illustrating a digital imaging system according to an example embodiment.

Referring to FIG. 3, a processor 302, an image sensor 300, and a display 304 communicate with each other via a bus 306. The processor 302 is configured to execute a program and control the digital imaging system. The image sensor 300 is configured to capture image data by converting optical images into electrical signals. The image sensor 300 may be an image sensor as described above with regard to FIG. 1, 2A or 2B. The processor 302 may include the image signal processor 108 shown in FIG. 1, and may be configured to process the captured image data for storage in a memory (not shown) and/or display by the display unit 304. The digital imaging system may be connected to an external device (e.g., a personal computer or a network) through an input/output device (not shown) and may exchange data with the external device.

For example, the digital imaging system shown in FIG. 3 may embody various electronic control systems including an image sensor (e.g., a digital camera), and may be used in, for example, mobile phones, personal digital assistants (PDAs), laptop computers, netbooks, tablet computers, MP3 players, navigation devices, household appliances, or any other device utilizing an image sensor or similar device.

Referring back to FIGS. 2A and 2B, in either architecture the counter 1044/1050 begins running when the ramp signal VRAMP starts falling. When the output VCOMP of a comparator 1042_COMP toggles, the ramp code for the corresponding pixel is (VSTART-VIN), where VSTART is the start voltage of the ramp signal VRAMP and VIN is the voltage input to the comparator 1042_COMP from the pixel array 100. The resultant digital output code DOUT is stored in the line buffer (for each column separately) and read out by an image signal processor.

If the digital output code DOUT of the ADC 104 (e.g., as shown in FIG. 1, 2A or 2B) is an M-bit digital word (where 'M' is an integer) and the counter clock cycle is tDCLK, then the ramp time tRAMP is greater than or equal to about $2^M \times tDCLK$ in order to obtain full output range. In practice, the counter counts significantly more because of correlated double sampling (CDS) as discussed in more detail with regard to FIG. 4.

FIG. 4 shows an example ramp signal VRAMP and corresponding input clock D_CLK for a CDS example.

Referring to FIG. 4, the input clock D_CLK is triggered at time t1, which corresponds to the time at which the ramp signal VRAMP begins to decrease over time. The input clock D_CLK continues to count until time t2 at which the ramp signal VRAMP no longer decreases over time. Then, at time t3 when the ramp signal VRAMP again begins to decrease over time, the input clock D_CLK is again triggered and continues counting until time t4 at which the input clock D_CLK stops because the ramp signal VRAMP is no longer decreasing over time.

In FIG. 4, the number of cycles of the input clock D_CLK determines the conversion time of the ADC (for a given clock rate) as well as the power consumed by the counters.

In conventional image sensors, the ADC resolution is the same for all converted voltages. However, the effective resolution of the image is reduced at higher illumination (e.g., lower voltage VIN) because of photon shot noise, which is proportional to the square root of the number of electrons gathered within a pixel. By employing a multi-resolution ADC, the conversion time and power may be reduced. A multi-resolution ADC employs a ramp signal as shown in FIG. 5.

Referring to FIG. 5, the slope of the ramp signal VRAMP between time t3 and t4 changes over time. For example, between time t3 and time t3a, the ramp signal VRAMP has a slope SLOPE1; between time t3a and t3b, the ramp signal VRAMP has a slope SLOPE2; and between time t3b and time t4, the ramp signal VRAMP has a slope SLOPE3. In this example, |SLOPE3|>|SLOPE2|>|SLOPE1|. By contrast, in the example shown in FIG. 4, the slope of the ramp signal VRAMP between time t3 and t4 is substantially constant.

Figure 6:
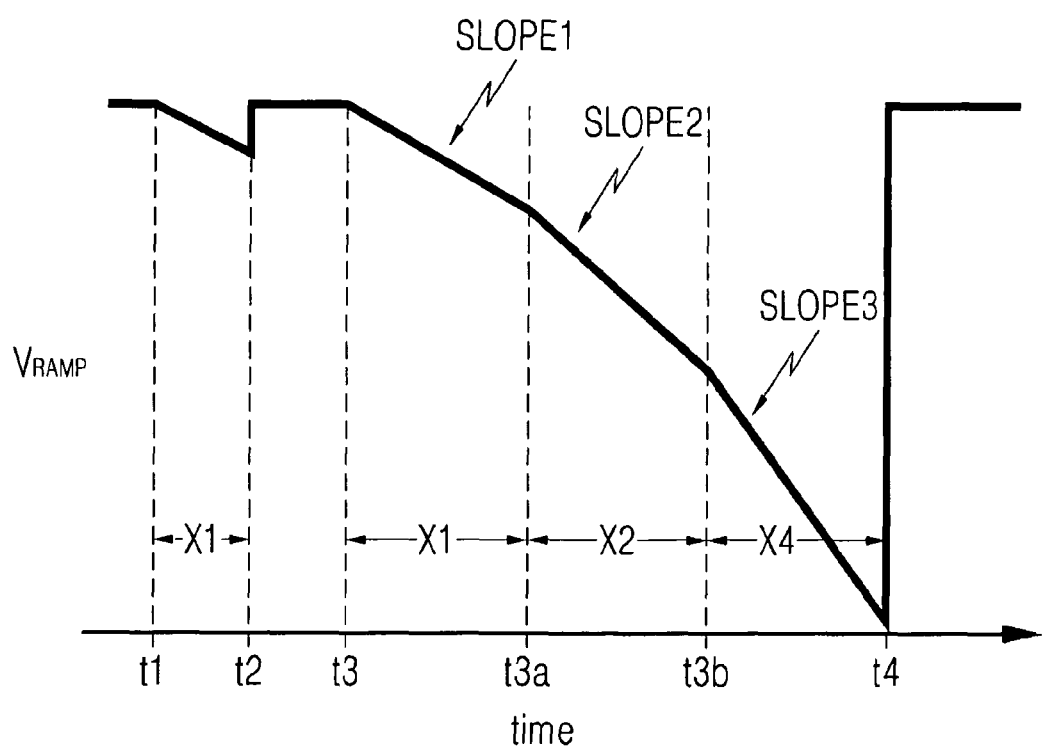
FIG. 6 illustrates counter digital gain increase factor overlayed on the graph shown in FIG. 5.

FIG. 6 shows the ramp signal of FIG. 5 with a digital gain increase factor overlay.

Referring to FIG. 6, X1 represents a digital gain increase factor of 1, X2 represents a digital gain increase factor of 2; and X4 represents a digital gain increase factor of 4. As shown in FIG. 6, the digital gains X2 and X4 are applied at the same or substantially the same time as the absolute value slope of the ramp signal VRAMP increases (e.g., at time t3a and t3b, respectively). Thus, the digital gain and the ramp signal VRAMP are correlated to one another.

According to at least some example embodiments, appropriate increases in digital gain (e.g., X1, X2, X4, etc.) are achieved by selectively bypassing a number of least significant bits (LSBs, or initial counter stages) within the counter, while maintaining the frequency of the input clock D_CLK.

It should be noted that each of the ramp signals shown in FIGS. 4-6 are relevant to a case in which digital CDS is employed. The second ramp shown in FIGS. 5 and 6 is relevant to analog CDS.

Figure 7:
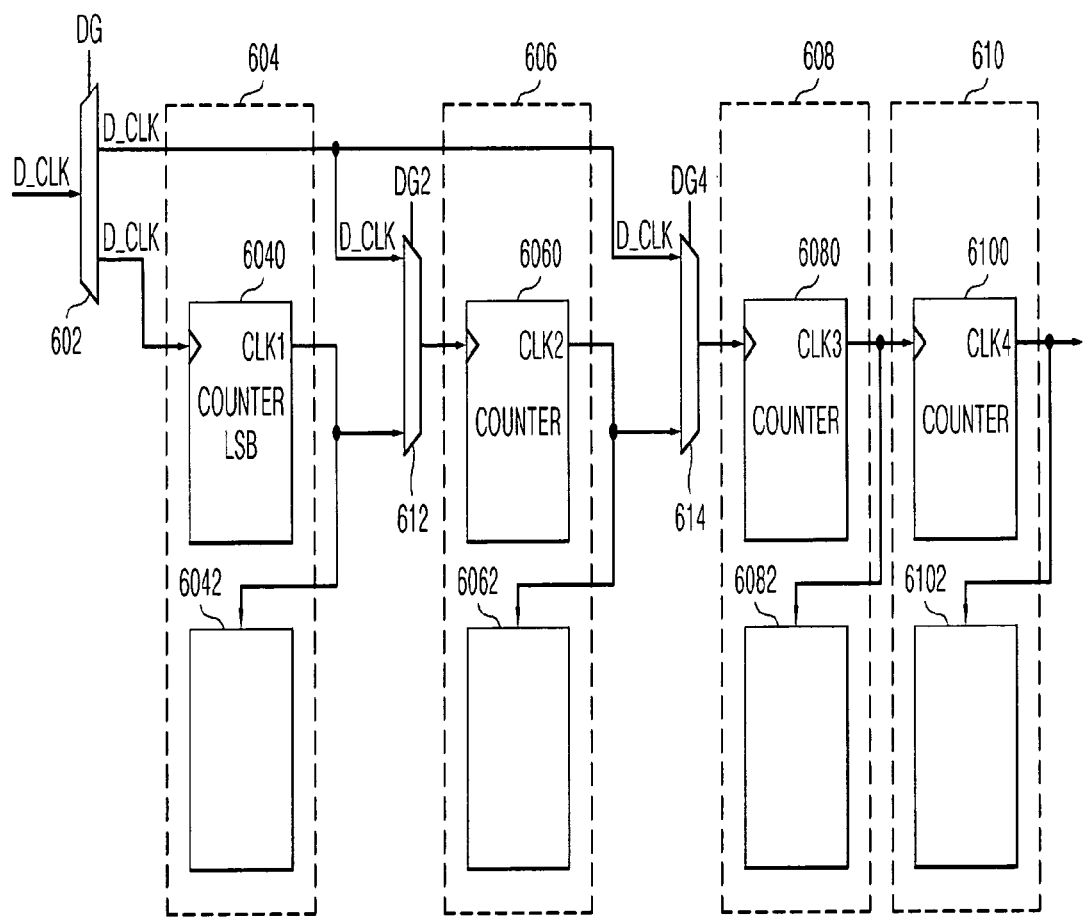
FIG. 7 illustrates a counter circuit according to an example embodiment.

FIG. 7 illustrates a counter circuit according to an example embodiment. The counter circuit shown in FIG. 7 may enable increases in step size from one least significant bit (LSB) to a plurality of (e.g., two, four, etc.) LSBs in order to increase digital gain. The step size, and thus, increases in digital gain may be extended to higher gains as desired.

In one example, a digital gain increased by a factor of $2^n$ (e.g., 1, 2, 4, etc.) is obtained by skipping the initial n counter stages (0 to n−1) of the counter circuit. Thus, the increase in digital gain is correlated to the number of initial counter stages that are skipped. The initial n stages of the counter circuit are skipped by halting or interrupting the toggling of outputs from the initial n counter stages. In accordance with at least this example embodiment, the subsequent counter stages obtain a valid clock (e.g., input clock D_CLK) so that the subsequent counters continue to toggle despite the skipping of the initial n counter stages. In one example embodiment, the output of each "skipped" counter stage is multiplexed with the input clock D_CLK such that subsequent ones of the n counter stages obtain a valid input clock, even when the outputs of the skipped counter stages no longer toggle.

As will be described in more detail below, the counter circuit shown in FIG. 7 includes a plurality of (e.g., n) counter stages 604, 606, 608, 610 configured to obtain an integer multiple (e.g., $2^n$, where n is an integer) of a digital gain for an ADC by bypassing, interrupting and/or skipping at least one initial counter stage 604, 606, 608, 610.

Referring to FIG. 7, a demultiplexer 602 receives the input clock D_CLK from a timing unit or circuit (not shown in FIG. 7) and selectively outputs the input clock D_CLK to a first multiplexer 612 and a second multiplexer 614, or a first counter stage 604 based on a first digital gain selection signal DG.

The first counter stage 604 includes: a first counter 6040 and a first storage device 6042. In one example, the first counter 6040 may be implemented by a flipflop circuit (e.g., a T-flipflop). Because flipflop circuits are generally known, a detailed discussion is omitted. The first storage device 6042 may be implemented by a static random access memory (SRAM), dynamic random access memory (DRAM), flash memory, etc.

In example operation, when the input clock D_CLK is input to the first counter 6040, the first counter 6040 generates a first output clock CLK1 based on the input clock D_CLK. In so doing, the first counter 6040 toggles the state (e.g., from low 'L' to high or high 'H' to low 'L') of the first output clock CLK1 based on a change in the state of the input clock D_CLK. For example, the first counter 6040 toggles the state of the first output clock CLK1 as the input clock D_CLK rises (e.g., in response to a transition from a low 'L' state to a high 'H' state).

The first multiplexer 612 selectively outputs one of the input clock D_CLK from the demultiplexer 602 and the first output clock CLK1 from the first counter 6040 in response to a second digital gain selection signal DG2. In one example, the second digital gain selection signal DG2 is correlated to the ramp signal (e.g., as shown in FIG. 6) such that the first multiplexer 612 outputs the first output clock CLK1 from the first counter 6040 when an increase factor X1 is desired (e.g., between t1 and t2, and between t3 and t3a), but outputs the input clock D_CLK to obtain an increase factor of X2 (e.g., between time t3a and t3b) or X4 (e.g., between t3b and t4). When the first multiplexer 612 outputs the input clock D_CLK, the first counter stage 604 is effectively bypassed, skipped or halted and an increase factor of X2 of X4 may be obtained.

The first multiplexer 612 outputs one of the input clock D_CLK and the first output clock CLK1 to the second counter stage 606.

The second counter stage 606 includes a second counter 6060 operatively coupled to a second storage device 6062. As is the case with the first counter stage 604, the second counter 6060 may be implemented by a flipflop circuit, and the second storage device 6062 may be implemented by a SRAM, DRAM, flash memory, etc.

In example operation, the second counter 6060 generates a second output clock CLK2 based on the input from the first multiplexer 612 (e.g., the input clock D_CLK or the first output clock CLK1). In so doing, the second counter 6060 toggles the state of the second output clock CLK2 based on a change in the state of the input from the first multiplexer 612. For example, the second counter 6060 toggles the state of the second output clock CLK2 as the input from the first multiplexer 612 rises (e.g., when the input from the first multiplexer 612 transitions from a low 'L' state to a high 'H' state). The second counter 6060 outputs the second output clock CLK2 to the second multiplexer 614.

As mentioned above, the second multiplexer 614 also receives the input clock D_CLK from the demultiplexer 602. The second multiplexer 614 selectively outputs one of the input clock D_CLK and the second output clock CLK2 in response to a third digital gain selection signal DG4. In one example, the third digital gain selection signal DG4 is also correlated to the ramp signal VRAMP (e.g., as shown in FIG. 6) such that the second multiplexer 614 outputs the second output clock CLK2 when an increase factor of X1 or X2 is desired (e.g., between t1 and t2, between t3 and t3a, and between t3a and t3b), but outputs the input clock D_CLK to obtain an increase factor of X4 (e.g., between time t3b and t4). When the second multiplexer 614 outputs the input clock D_CLK, the first and second counter stages 604 and 606 are effectively bypassed, skipped or halted and an increase factor of X4 may be obtained.

The second multiplexer 614 outputs the input clock signal D_CLK or the second output clock CLK2 to the third counter stage 608.

The third counter stage 608 includes a third counter 6080 operatively coupled to a third storage device 6082. As with the first and second counter stages 604 and 606, the third counter 6080 may be implemented by a flipflop circuit, and the third storage device 6082 may be implemented by a SRAM, DRAM, flash memory, etc.

In example operation, the third counter 6080 generates a third output clock CLK3 based on the input from the second multiplexer 614 (e.g., the input clock D_CLK or the second output clock CLK2). In so doing, the third counter 6080 toggles the state of the third output clock CLK3 based on a change in the state of the input from the second multiplexer 614. For example, the third counter 6080 toggles the state of the third output clock CLK3 as the input from the second multiplexer 614 rises (e.g., in response to a transition from the low 'L' state to the high 'H' state).

The third counter stage 608 is coupled to a fourth counter stage 610, which includes: a fourth counter 6100 operatively coupled to a fourth storage device 6102. The fourth counter 6100 may also be implemented by a flipflop circuit, and the fourth storage device 6102 may be implemented by a SRAM, DRAM, flash memory, etc.

In example operation, the fourth counter 6100 generates a fourth output clock CLK4 based on the third output clock CLK3. In so doing, the fourth counter 6100 toggles the state of the fourth output clock CLK4 based on a change in the state of third input clock CLK3. For example, the fourth counter 6100 toggles the state of the fourth output clock CLK4 as the third output clock CLK3 rises (e.g., response to a transition from the low 'L' state to the high 'H' state).

The fourth counter 6100 outputs the fourth output clock CLK4 to a line memory (e.g., line memory 1046 shown in FIG. 2A or line memory 1048 shown in FIG. 2B), which stores the state of the fourth output clock CLK4, assuming that the fourth counter stage 610 is the last counter stage. Otherwise, the fourth counter stage 610 outputs the fourth output clock CLK4 to a subsequent counter stage, and the counter circuit continues operating as discussed above.

Abbreviated, but somewhat more specific example operations of the counter circuit shown in FIG. 7 will now be described with regard to the desired increase factor (e.g., X1, X2, X4, etc.).

Referring still to FIG. 7, if the desired increase factor is X1 (e.g., $2^0=1$), the demultiplexer 602 outputs the input clock D_CLK to the first counter 6040. As mentioned above, the first counter 6040 outputs the first output clock CLK1 to the first multiplexer 612 and the first storage device 6042 based on the input clock D_CLK.

In this example, the first multiplexer 612 outputs the first output clock CLK1 to the second counter 6060, which then outputs the second output clock CLK2 to the storage device 6062 and the second multiplexer 614 based on the first output clock CLK1.

The second multiplexer 614 outputs the second output clock CLK2 to the third counter 6080, which then outputs the third output clock CLK3 to the fourth counter 6100 based on the second output clock CLK2.

The fourth counter 6100 outputs the fourth output clock CLK4 to a line memory based on the third output clock CLK3.

Referring still to FIG. 7, if the desired increase factor is X2 (e.g., $2^1=2$), the initial counter stage 604 is skipped. More specifically, the demultiplexer 602 outputs the input clock D_CLK to the first multiplexer 612 and the second multiplexer 614, rather than the first counter stage 604.

In this example, the first multiplexer 612 outputs the input clock D_CLK to the second counter 6060, which then outputs the second output clock CLK2 to the storage device 6062 and the second multiplexer 614 based on the input clock D_CLK.

The second multiplexer 612 outputs the second output clock CLK2 to the third counter 6080, which then outputs the third output clock CLK3 to the fourth counter 6100 based on the second output clock CLK2.

The fourth counter 6100 outputs the fourth output clock CLK4 to a line memory based on the third output clock CLK3.

Referring again to FIG. 7, if the desired increase factor is X4 (e.g., $2^2=4$), the counter stages 604 and 606 are effectively skipped.

In this example, the demultiplexer 602 again outputs the input clock D_CLK to the first multiplexer 612 and the second multiplexer 614, rather than the first counter stage 604.

Contrary to the examples in which the desired increase factor is X1 or X2, the second multiplexer 614 outputs the input clock D_CLK to the third counter 6080 thereby skipping, bypassing or halting toggling of the first and second counter stages 604 and 606. The third counter 6080 then outputs the third output clock CLK3 to the fourth counter 6100 based on the input clock D_CLK.

The fourth counter 6100 then outputs the fourth output clock CLK4 to the line memory based on the third output clock CLK3.

Although FIG. 7 shows only four counter stages, example embodiments may include any number of counter stages.

Because the power consumed by each stage in the counter circuit is proportional to the frequency of the input clock, power may be conserved by using a double data rate (DDR) counter circuit rather than a standard ripple counter circuit. In a DDR counter circuit, the input clock rate is reduced by half and the clock itself is used as the LSB of the output data.

Figure 8:
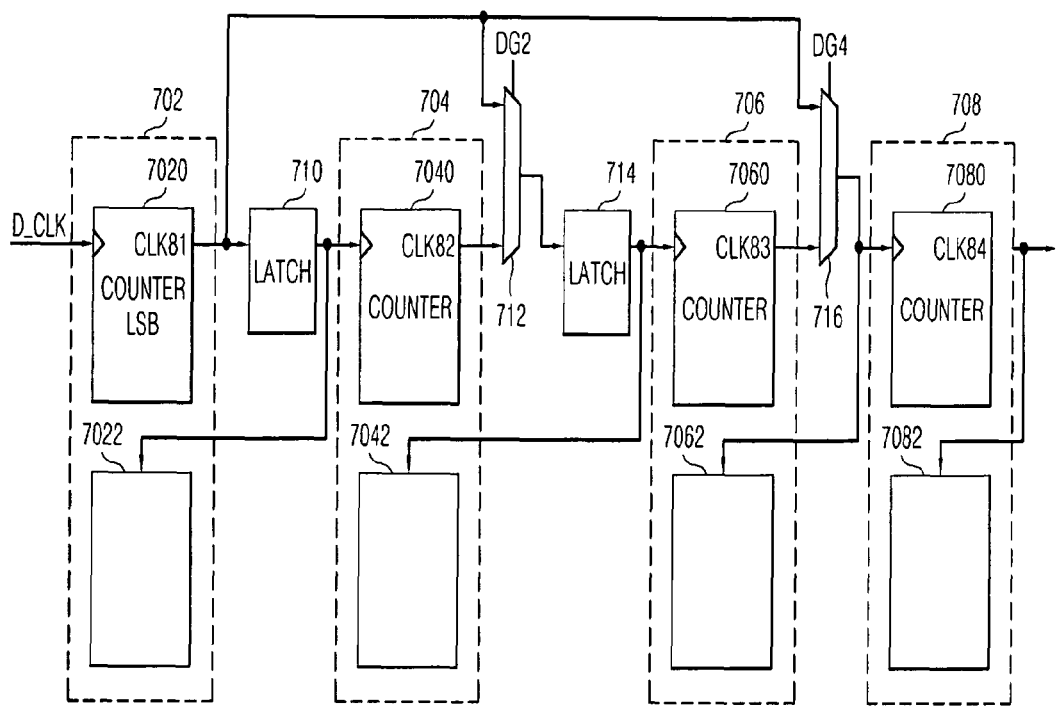
FIG. 8 illustrates a double data rate (DDR) counter circuit according to an example embodiment.

FIG. 8 illustrates a counter circuit according to another example embodiment. The counter circuit shown in FIG. 8 may be applicable to a DDR counter.

Referring to FIG. 8, an output of a first counter stage 702 is coupled to an input of a first latch 710, a first input of a first multiplexer 712 and a first input of a second multiplexer 716. The first counter stage 702 includes a first counter circuit 7020 and a first storage device 7022.

The output of the first latch 710 is coupled to the input of a second counter stage 704 and an input of the first storage device 7022. The second counter stage 704 includes a second counter 7040 and a second storage device 7042. The output of the second counter stage 704 is coupled to a second input of the first multiplexer 712. The output of the first multiplexer 712 is coupled to an input of a second latch 714. The output of the second latch 714 is coupled to the second storage device 7042 and an input of the third counter stage 706. The third counter stage 706 includes a third counter 7060 and a third storage device 7062.

The output of the third counter stage 706 is coupled to a second input of the second multiplexer 716. The output of the second multiplexer 716 is coupled to the third storage device 7062 and an input of the fourth counter stage 708. The fourth counter stage 708 includes a fourth counter 7080 and a fourth storage device 7082. If the fourth counter stage 708 is the final counter stage, the output of the fourth counter stage 708 is coupled to a line memory. Otherwise, the fourth counter stage 708 may be coupled to further counter stages similar or substantially similar to those described above.

In a DDR counter according to at least this example embodiment, the first counter stage 702 is not bypassed as in the example embodiment shown in FIG. 7. Rather, the output of the first counter stage 702 is continually used to avoid frequency dividing. Additional latches are added to the lowest n bits to separate between the counter and its storage device (e.g., RAM cell), while connecting the LSB (DDR) counter to the nth stage storage device to achieve a gain of 2n.

Referring still to FIG. 8, in example operation, the first counter 7020 generates a first output clock CLK81 based on the input clock D_CLK. In so doing, the first counter 7020 toggles the state (e.g., from high 'H' to low 'L' or from low 'L' to high 'H') of the first output clock CLK81 based on a change in the state of the input clock D_CLK. For example, the first counter 7020 toggles the state of the first output clock CLK81 as the input clock D_CLK rises (e.g., in response to a transition from a low 'L' state to a high 'H' state).

The first counter 7020 outputs the first output clock CLK81 to the first latch circuit 710, the first input of the first multiplexer 712, and the first input of the second multiplexer 716.

The first latch 710 stores and then outputs the input state of the first output clock CLK81 according to a second digital gain selection signal DG2. In one example, the first latch circuit 710 delays the first output clock CLK81 by one clock cycle and outputs the delayed first output clock CLK81 in response to the second digital gain selection signal DG2.

In response to the second digital gain selection signal DG2, the first latch circuit 710 outputs the delayed first output clock CLK81 to the first storage circuit 7022 as well as the second counter 7040.

The second counter 7040 generates a second output clock CLK82 based on the first output clock CLK81 from the first latch circuit 710. In so doing, the second counter 7040 toggles the state of the second output clock CLK82 based on a change in the state of the first output clock CLK81 from the first latch circuit 710. For example, the second counter 7040 toggles the state of the second output clock CLK82 as the first input clock CLK81 rises (e.g., in response to a transition from a low 'L' state to a high 'H' state).

The second counter 7040 outputs the second output clock CLK82 to the second input of the first multiplexer 712. As noted above, the first output clock CLK81 is input to the first input of the first multiplexer 712.

The first multiplexer 712 selectively outputs one of the first output clock CLK81 from the first counter 7020 and the second output clock CLK82 from the second counter 7040 based on the second digital gain selection signal DG2. In one example, the first multiplexer 712 outputs the first output clock CLK81 to obtain a digital gain increased by a factor of 2. Otherwise, the first multiplexer 712 outputs the second output clock CLK82.

The output from the first multiplexer 712 is input to the second latch circuit 714. The second latch circuit 714 stores and outputs the output from the first multiplexer 712. In one example, the second latch circuit 714 delays the input from the first multiplexer 712 by one clock cycle and outputs the delayed clock in response to the third digital gain selection signal DG4. The second latch circuit 714 outputs the delayed clock to the second storage circuit 7042 as well as the third counter 7060.

The third counter 7060 generates a third output clock CLK83 based on the output from the second latch circuit 714. In so doing, the third counter 7060 toggles the state of the third output clock CLK83 based on a change in the state of the input from the second latch circuit 714. For example, the third counter 7060 toggles the state of the third output clock CLK83 as the output from the second latch circuit 714 rises (e.g., in response to a transition from a low 'L' state to a high 'H' state). The third counter 7060 outputs the third output clock CLK83 to the second input of the second multiplexer 716. As mentioned above, the first output clock CLK81 is input to the first input of the second multiplexer 716.

The second multiplexer 716 selectively outputs one of the first input clock CLK81 and the third input clock CLK83 based on the third digital gain selection signal DG4. In one example, the second multiplexer 716 outputs the first output clock CLK81 in order to obtain an increase in digital gain by a factor of 4. Otherwise, to obtain an increase in digital gain by a factor of 1 or 2 (depending on whether the second counter stage 704 has been skipped), the second multiplexer 716 outputs the third clock CLK83. In this example, if the first multiplexer 712 outputs the second output clock CLK82 and the second multiplexer 716 outputs the third output clock CLK83, the digital gain is increased by a factor of 1 because neither the second counter stage 704 nor the third counter stage 706 is skipped. If the first multiplexer 712 outputs the first output clock CLK81 and the second multiplexer 716 outputs the third output clock CLK83, the digital gain is increased by a factor of 2 because the second counter stage 704 is skipped. If the first multiplexer 712 and/or the second multiplexer 716 output the first output clock CLK81, the digital gain is increased by a factor of 4 because the second and third counter stages 704 and 706 are skipped.

The output from the second multiplexer 716 is input to the fourth counter 7080 and the third storage circuit 7062.

The fourth counter 7080 generates a fourth output clock CLK84 based on the input from the second multiplexer 716. In so doing, the fourth counter 7080 toggles the state of the fourth output clock CLK84 based on a change in the state of the input from the second multiplexer 716. For example, the fourth counter 7080 toggles the state of the fourth output clock CLK84 as the input from the second multiplexer 716 rises (e.g., in response to a transition from a low 'L' state to a high 'H' state).

The fourth counter 7080 outputs the fourth output clock CLK84 to the fourth storage device 7082 and a line memory (e.g., line memory 1046 shown in FIG. 2A or line memory 1048 shown in FIG. 2B), which stores the state of the fourth output clock CLK84, if the fourth counter stage 708 is the final counter stage in the counter.

Although FIG. 8 shows only four counter stages, example embodiments may include any number of counter stages.

Counter circuits according to example embodiments may be implemented in conjunction with the image sensors shown in FIGS. 1, 2A and/or 2B. For example, the counter circuits discussed herein may replace the GCC counter 1050 shown in FIG. 2B, or may be used as a counter in the per-column counter bank 1044 shown in FIG. 2A.

The foregoing description of example embodiments has been provided for purposes of illustration and description. It is not intended to be exhaustive or limiting. Individual elements or features of a particular embodiment are generally not limited to that particular embodiment. Rather, where applicable, individual elements or features are interchangeable and may be used in a selected embodiment, even if not specifically shown or described. The same may also be varied in many ways. All such modifications are intended to be included within the scope of this disclosure.

What is claimed is:
1. A counter circuit for an analog to digital converter, the counter circuit comprising:

a plurality of counter stages configured to obtain an integer multiple of a digital gain for the analog to digital converter by bypassing at least one of the plurality of counter stages;
a first multiplexer coupled between a first and a second of the plurality of counter stages; and
a demultiplexer configured to selectively output a received clock to the first of the plurality of counter stages and the first multiplexer, wherein,
the first counter stage includes a first counter configured to toggle a state of a first output clock in response to a change in state of the received clock, and
the first multiplexer is configured to selectively output the received clock and the first output clock in response to a first digital gain selection signal.

2. The counter circuit of claim 1, further comprising:
a second multiplexer coupled between the second of the plurality of counter stages and a third of the plurality of counter stages; wherein the second of the plurality of counter stages includes,
a second counter configured to toggle a state of a second output clock in response to a change in state of an input from the first multiplexer, and wherein
the second multiplexer is configured to selectively output one of the received clock and the second output clock in response to a second digital gain selection signal.

3. The counter circuit of claim 2, wherein remaining ones of the plurality of counter stages are connected in series with the third of the plurality of counter stages, each remaining one of the plurality of counter stages including,
a counter circuit configured to toggle a state of an output clock in response to a change in state of an input clock from a preceding counter stage; and
a storage device configured to store the state of the output clock.

4. An analog to digital converter having increased digital gain, the analog to digital converter comprising:
a comparator circuit, configured to generate a comparison signal corresponding to each column of a pixel array, each comparison signal being generated based on a comparison between an input signal corresponding to a column of the pixel array and a ramp signal;
a counter bank configured to convert each of the generated comparison signals into a digital output signal, the counter bank including at least one counter circuit, the at least one counter circuit including a plurality of counter stages configured to obtain an integer multiple of a digital gain for the analog to digital converter by bypassing at least one of the plurality of counter stages; and
a line memory configured to store the digital outputs from the counter bank.

5. The digital to analog converter of claim 4, wherein the counter bank includes a plurality of counter circuits, each of the plurality of counter circuits corresponding to a column of the pixel array, and wherein each of the plurality of counter circuits is configured to convert an output of the corresponding column of the pixel array into a digital output signal.

6. The analog to digital converter of claim 5, wherein each of the plurality of counter circuits comprises:
a first multiplexer coupled between a first and a second of the plurality of counter stages; and
a demultiplexer configured to selectively output a received clock to the first of the plurality of counter stages and the first multiplexer; wherein the first counter stage includes,
a first counter configured to toggle a state of a first output clock in response to a change in state of the received clock; and wherein
the first multiplexer is configured to selectively output the received clock and the first output clock in response to a first digital gain selection signal.

7. The analog to digital converter of claim 6, wherein each of the plurality of counter circuits further comprises:
a second multiplexer coupled between the second of the plurality of counter stages and a third of the plurality of counter stages; wherein the second of the plurality of counter stages includes,
a second counter configured to toggle a state of a second output clock in response to a change in state of the output from the first multiplexer.

8. The analog to digital converter of claim 7, wherein remaining ones of the plurality of counter stages are connected in series with the third of the plurality of counter stages, each remaining counter stage comprising:
a counter configured to toggle a state of an output clock in response to a change in state of an input clock from a preceding counter stage; and
a storage device configured to store the state of the output clock from the counter.

9. The analog to digital converter of claim 4, wherein the counter bank includes a single counter circuit shared by each of the plurality of columns of pixels.

10. The analog to digital converter of claim 9, wherein the single counter circuit comprises:
a first multiplexer coupled between a first and a second of the plurality of counter stages; and
a demultiplexer configured to selectively output a received clock to the first of the plurality of counter stages and the first multiplexer; wherein the first counter stage includes,
a first counter configured to toggle a state of a first output clock in response to a change in state of the received clock; and wherein
the first multiplexer is configured to selectively output the received clock and the first output clock in response to a first digital gain selection signal.

11. The analog to digital converter of claim 10, wherein the single counter circuit further comprises:
a second multiplexer coupled between the second of the plurality of counter stages and a third of the plurality of counter stages; wherein the second of the plurality of counter stages includes,
a second counter configured to toggle a state of a second output clock in response to a change in state of the output from the first multiplexer.

12. The analog to digital converter of claim 11, wherein remaining ones of the plurality of counter stages are connected in series with the third of the plurality of counter stages, each remaining counter stage comprising:
a counter configured to toggle a state of an output clock in response to a change in state of an input clock from a preceding counter stage; and
a storage device configured to store the state of the output clock from the counter.

13. An image sensor comprising:
an active pixel array including a plurality of pixels arranged in an array;
a line driver configured to select rows of pixels for output by the active pixel array; and
the analog to digital converter of claim 4.

14. The image sensor of claim 13, wherein the counter circuit comprises:

a first multiplexer coupled between a first and a second of the plurality of counter stages; and a demultiplexer configured to selectively output a received clock to the first of the plurality of counter stages and the first multiplexer; wherein the first counter stage includes, a first counter configured to toggle a state of a first output clock in response to a change in state of the received clock; and wherein the first multiplexer is configured to selectively output one of the received clock and the first output clock in response to a first digital gain selection signal.

15. The image sensor of claim 14, wherein the counter circuit further comprises:

a second multiplexer coupled between the second of the plurality of counter stages and a third of the plurality of counter stages; wherein the second of the plurality of counter stages includes, a second counter configured to toggle a state of a second output clock in response to a change in state of the output from the first multiplexer, and wherein the second multiplexer is configured to selectively output one of the received clock and the second output clock in response to a second digital gain selection signal.

16. The image sensor of claim 15, wherein remaining ones of the plurality of counter stages are connected in series with the third of the plurality of counter stages, each remaining one of the plurality of counter stage comprising:

a counter circuit configured to toggle a state of an output clock in response to a change in state of an input clock from a preceding counter stage; and a storage device configured to store the state of the output clock.

17. A digital imaging system comprising:

a processor configured to process captured image data; and the image sensor of claim 13 configured to capture image data by converting optical images into electrical signals.

18. The digital imaging system of claim 17, wherein the counter circuit comprises:

a first multiplexer coupled between a first and a second of the plurality of counter stages; and a demultiplexer configured to selectively output a received clock to the first of the plurality of counter stages and the first multiplexer; wherein the first counter stage includes, a first counter configured to toggle a state of a first output clock in response to a change in state of the received clock; and wherein the first multiplexer is configured to selectively output one of the received clock and the first output clock in response to a first digital gain selection signal.

19. The digital imaging system of claim 18, wherein the counter circuit further comprises:

a second multiplexer coupled between the second of the plurality of counter stages and a third of the plurality of counter stages; wherein the second of the plurality of counter stages includes, a second counter configured to toggle a state of a second output clock in response to a change in state of the output from the first multiplexer, and wherein the second multiplexer is configured to selectively output one of the received clock and the second output clock in response to a second digital gain selection signal.

20. The digital imaging system of claim 19, wherein remaining ones of the plurality of counter stages are connected in series with the third of the plurality of counter stages, each remaining one of the plurality of counter stage comprising, a counter circuit configured to toggle a state of an output clock in response to a change in state of an input clock from a preceding counter stage; and a storage device configured to store the state of the output clock.

21. A counter circuit for an analog to digital converter, the counter circuit comprising:

a plurality of counter stages configured to obtain an integer multiple of a digital gain for the analog to digital converter by bypassing at least one of the plurality of counter stages; and a first latch coupled between a first and a second of the plurality of counter stages, wherein, the first of the plurality of counter stages includes a first counter configured to toggle a state of a first output clock in response to a change in state of a received clock, and the first latch is configured to store and output the first output clock based on a first digital gain selection signal.

22. The counter circuit of claim 21, wherein the second of the plurality of counter stages includes a second counter configured to toggle a state of a second output clock in response to a change in state of an output from the first latch, the counter circuit further comprising:

a first multiplexer configured selectively output one of the first output clock and the second output clock in response to a second digital gain selection signal; and a second latch configured to delay the output from the first multiplexer in response to a second digital gain selection signal.

23. The counter circuit of claim 22, wherein remaining ones of the plurality of counter stages are connected serially with the second of the plurality of counter stages; wherein a third of the plurality of counter stages is configured to toggle a state of a third output clock in response to a change in state of the output from the second latch, and a second multiplexer is coupled between the third and a fourth of the plurality of counter stages, the second multiplexer being configured to selectively output one of the first output clock and the third output clock in response to the second digital gain selection signal.

24. The analog to digital converter of claim 5, wherein each of the plurality of counter circuits further comprises:

a first latch coupled between a first and a second of the plurality of counter stages, wherein the first of the plurality of counter stages includes, a first counter configured to toggle a state of a first output clock in response to a change in state of a received clock; and wherein the first latch is configured to store and output the first output clock based on a first digital gain selection signal.

25. The analog to digital converter of claim 24, wherein the second of the plurality of counter stages includes a second counter configured to toggle a state of a second output clock in response to a change in state of an output from the first latch, and each of the plurality of counter circuits further comprises:

a first multiplexer configured selectively output one of the first output clock and the second output clock in response to a second digital gain selection signal; and a second latch configured to delay the output from the first multiplexer in response to a second digital gain selection signal.

26. The analog to digital converter of claim 25, wherein remaining ones of the plurality of counter stages are connected serially with the second of the plurality of counter stages; and wherein
- a third of the plurality of counter stages is configured to toggle a state of a third output clock in response to a change in state of the output from the second latch, and
- a second multiplexer is coupled between the third and a fourth of the plurality of counter stages, the second multiplexer being configured to selectively output one of the first output clock and the third output clock in response to the second digital gain selection signal.

27. The analog to digital converter of claim 9, wherein the single counter circuit further comprises:
- a first latch coupled between a first and a second of the plurality of counter stages, wherein the first of the plurality of counter stages includes,
- a first counter configured to toggle a state of a first output clock in response to a change in state of a received clock; and wherein
- the first latch is configured to store and output the first output clock based on a first digital gain selection signal.

28. The analog to digital converter of claim 27, wherein the second of the plurality of counter stages includes a second counter configured to toggle a state of a second output clock in response to a change in state of an output from the first latch, and the single counter circuit further comprises:
- a first multiplexer configured selectively output one of the first output clock and the second output clock in response to a second digital gain selection signal; and
- a second latch configured to delay the output from the first multiplexer in response to a second digital gain selection signal.

29. The analog to digital converter of claim 28, wherein remaining ones of the plurality of counter stages are connected serially with the second of the plurality of counter stages; and wherein
- a third of the plurality of counter stages is configured to toggle a state of a third output clock in response to a change in state of the output from the second latch, and
- a second multiplexer is coupled between the third and a fourth of the plurality of counter stages, the second multiplexer being configured to selectively output one of the first output clock and the third output clock in response to the second digital gain selection signal.

30. The image sensor of claim 13, wherein the single counter circuit comprises:
- a first latch coupled between a first and a second of the plurality of counter stages, wherein the first of the plurality of counter stages includes,
- a first counter configured to toggle a state of a first output clock in response to a change in state of a received clock; and wherein
- the first latch is configured to store and output the first output clock based on a first digital gain selection signal.

31. The image sensor of claim 30, wherein the second of the plurality of counter stages includes a second counter configured to toggle a state of a second output clock in response to a change in state of an output from the first latch, and the counter circuit further comprises:
- a first multiplexer configured selectively output one of the first output clock and the second output clock in response to a second digital gain selection signal; an
- a second latch configured to delay the output from the first multiplexer in response to a second digital gain selection signal.

32. The image sensor of claim 31, wherein remaining ones of the plurality of counter stages are connected serially with the second of the plurality of counter stages; and wherein
- a third of the plurality of counter stages is configured to toggle a state of a third output clock in response to a change in state of the output from the second latch, and
- a second multiplexer is coupled between the third and a fourth of the plurality of counter stages, the second multiplexer being configured to selectively output one of the first output clock and the third output clock in response to the second digital gain selection signal.

33. The digital imaging system of claim 17, wherein the counter circuit further comprises:
- a first latch coupled between a first and a second of the plurality of counter stages, wherein the first of the plurality of counter stages includes,
- a first counter configured to toggle a state of a first output clock in response to a change in state of a received clock; and wherein
- the first latch is configured to store and output the first output clock based on a first digital gain selection signal.

34. The digital imaging system of claim 33, wherein the second of the plurality of counter stages includes a second counter configured to toggle a state of a second output clock in response to a change in state of an output from the first latch, and the counter circuit further comprises:
- a first multiplexer configured selectively output one of the first output clock and the second output clock in response to a second digital gain selection signal; and
- a second latch configured to delay the output from the first multiplexer in response to a second digital gain selection signal.

35. The digital imaging system of claim 34, wherein remaining ones of the plurality of counter stages are connected serially with the second of the plurality of counter stages; and wherein
- a third of the plurality of counter stages is configured to toggle a state of a third output clock in response to a change in state of the output from the second latch, and
- a second multiplexer is coupled between the third and a fourth of the plurality of counter stages, the second multiplexer being configured to selectively output one of the first output clock and the third output clock in response to the second digital gain selection signal.

* * * * *